US012635334B2

(12) United States Patent
Han et al.

(10) Patent No.: US 12,635,334 B2
(45) Date of Patent: May 19, 2026

(54) LIGHT EMITTING DISPLAY DEVICE HAVING BUMPY PATTERN ON RAMP

(71) Applicant: LG DISPLAY CO., LTD., Seoul (KR)

(72) Inventors: Jun Hee Han, Paju-si (KR); Su Min Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 687 days.

(21) Appl. No.: 17/977,487

(22) Filed: Oct. 31, 2022

(65) Prior Publication Data

US 2023/0217679 A1 Jul. 6, 2023

(30) Foreign Application Priority Data

Dec. 31, 2021 (KR) ........................ 10-2021-0194771

(51) Int. Cl.
*H10K 50/813* (2023.01)
*H10K 59/122* (2023.01)
*H10K 59/38* (2023.01)
*H10K 102/00* (2023.01)

(52) U.S. Cl.
CPC ......... *H10K 50/813* (2023.02); *H10K 59/122* (2023.02); *H10K 59/38* (2023.02); *H10K 2102/341* (2023.02)

(58) Field of Classification Search
CPC .... H10K 50/813; H10K 59/122; H10K 59/38; H10K 2102/341; H10K 59/124; H10K 59/35; H10K 50/81; H10K 50/82
USPC ......................................................... 257/40
See application file for complete search history.

(56) References Cited

U.S. PATENT DOCUMENTS

| | | | |
|---|---|---|---|
| 2005/0040756 A1* | 2/2005 | Winters | H10K 59/351 |
| | | | 313/504 |
| 2007/0290607 A1 | 12/2007 | Okada et al. | |
| 2014/0097409 A1* | 4/2014 | Choi | H10K 59/124 |
| | | | 257/40 |
| 2015/0060832 A1* | 3/2015 | Ito | H10K 50/822 |
| | | | 257/40 |
| 2016/0087017 A1* | 3/2016 | Park | H10K 59/124 |
| | | | 257/40 |
| 2016/0226013 A1* | 8/2016 | Liu | H10K 59/80515 |
| 2019/0074331 A1* | 3/2019 | Oh | H10K 50/813 |
| 2019/0081264 A1* | 3/2019 | Yun | H10K 59/38 |
| 2019/0165052 A1 | 5/2019 | Son et al. | |
| 2020/0395570 A1* | 12/2020 | Nakamura | H10K 59/878 |
| 2021/0183963 A1 | 6/2021 | Jang et al. | |

FOREIGN PATENT DOCUMENTS

| KR | 10-2083459 B1 | 3/2020 |
|---|---|---|
| KR | 10-2021-0077476 A | 6/2021 |

* cited by examiner

*Primary Examiner* — Duy T Nguyen
(74) *Attorney, Agent, or Firm* — Birch, Stewart, Kolasch & Birch, LLP

(57) ABSTRACT

A light emitting display device can be configured so that a ramp and a bumpy pattern are provided in a first direction in which a horizontal distance between subpixels is small. As a result, the physical distance between anodes of adjacent subpixels can be increased, a normal separation between the anodes of adjacent subpixels is possible, and a mixture of colors between the adjacent subpixels depending on a viewing angle can be prevented.

19 Claims, 9 Drawing Sheets

Residual Film

Bright dot defect

Short

LIGHT EMITTING DISPLAY DEVICE HAVING BUMPY PATTERN ON RAMP

CROSS-REFERENCE TO RELATED APPLICATIONS

This application claims priority to Korean Patent Application No. 10-2021-0194771, filed in the Republic of Korea on Dec. 31, 2021, the entire contents of which are hereby incorporated by reference into the present application.

BACKGROUND OF THE INVENTION

Field of the Invention

The present disclosure relates to a light emitting display device, and more particularly to a light emitting display device configured such that a residual film between anodes of adjacent subpixels is prevented even in a high-resolution state, a normal separation between the anodes is possible, and reliability thereof is improved.

Discussion of the Related Art

With recent approach to a full-scale information age, displays capable of visually expressing electrical information signals have been rapidly developed. Correspondingly, various display devices having excellent performance, such as slimness, light weight, and low power consumption, have been developed and have rapidly replaced a conventional cathode ray tube (CRT).

Among the display devices, a light emitting display device has been considered as a competitive application in order to achieve compaction of the device and vivid color display without necessity of a separate light source.

The light emitting display device includes a plurality of subpixels, wherein each subpixel is provided with a light emitting element. The light emitting element includes an anode, an organic layer, and a cathode. With increasing resolution of the light emitting display device, the distance between anodes of adjacent subpixels has been reduced. In this case, the adjacent anodes may not be normally separated from each other due to a residual film between the adjacent anodes, whereby a short circuit can occur. Even when a specific subpixel is turned off, backlight bleed can occur due to turn-on of a subpixel adjacent thereto.

SUMMARY OF THE INVENTION

Accordingly, the present disclosure is directed to a light emitting display device that substantially obviates one or more problems due to limitations and disadvantages of the related art.

It is an object of the present disclosure to provide a light emitting display device configured such that a ramp and a bumpy pattern are provided in a first direction in which a horizontal distance between subpixels is small, whereby the physical distance between anodes of adjacent subpixels is increased and normal separation between the anodes of adjacent subpixels is possible.

To achieve these objects and other advantages and in accordance with the purpose of the invention, as embodied and broadly described herein, a light emitting display device can include a substrate having a plurality of subpixels, an organic insulating film having first ramps and second ramps alternately formed so as to correspond to the subpixels in a first direction, each of the second ramps being provided with a bumpy pattern, an anode provided at each of the subpixels along a corresponding one of the first ramps on the organic insulating film, the anode having a predetermined thickness, a bank provided on the organic insulating film so as to overlap entireties of the second ramps and parts of the anodes on the first ramps of both adjacent subpixels in the first direction, and an organic layer and a cathode provided on the anode.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a perspective view showing a light emitting display device according to an embodiment of the present disclosure;

FIG. 7 is a circuit diagram corresponding to one subpixel of FIG. 3;

DETAILED DESCRIPTION OF THE EMBODIMENTS

Figure 2:
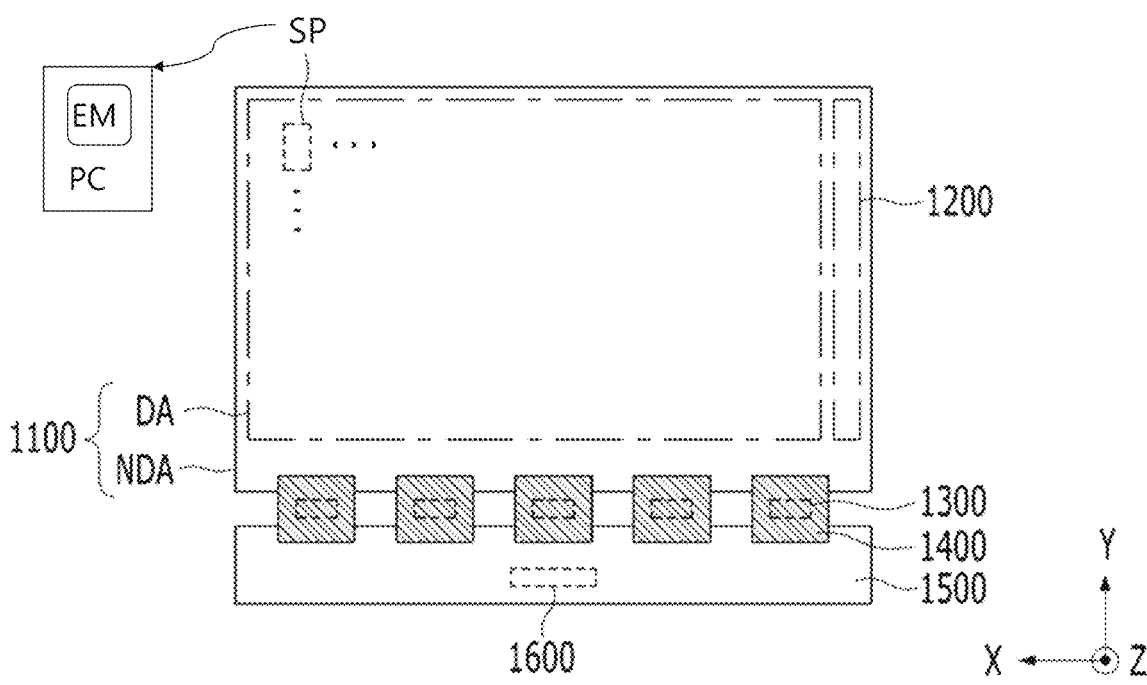
FIG. 2 is a plan view showing a substrate of FIG. 1.

Reference will now be made in detail to preferred embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same can obscure the subject matter of the present invention. In addition, the names of elements used in the following description are selected in consideration of clarity of description of the specification, and can differ from the names of elements of actual products.

The shape, size, ratio, angle, number, and the like shown in the drawings to illustrate various embodiments of the present invention are merely provided for illustration, and the invention is not limited to the content shown in the drawings. In the following description, detailed descriptions of technologies or configurations related to the present invention can be omitted so as to avoid unnecessarily obscuring the subject matter of the present invention. When terms such as "including", "having", and "comprising" are used throughout the specification, an additional component can be present, unless "only" is used. A component described in a singular form encompasses a plurality thereof unless particularly stated otherwise.

The components included in the embodiments of the present invention should be interpreted to include an error range, even if there is no additional particular description thereof.

In describing the variety of embodiments of the present invention, when terms describing positional relationships such as "on", "above", "under" and "next to" are used, at least one intervening element can be present between the two elements, unless "immediately" or "directly" is used.

In describing the variety of embodiments of the present invention, when terms related to temporal relationships, such as "after", "subsequently", "next" and "before", are used, the non-continuous case can be included, unless "immediately" or "directly" is used.

In describing the variety of embodiments of the present invention, terms such as "first" and "second" can be used to describe a variety of components, but these terms only aim to distinguish the same or similar components from one another and may not define order. Accordingly, throughout the specification, a "first" component can be the same as a "second" component within the technical concept of the present invention, unless specifically mentioned otherwise.

Features of various embodiments of the present disclosure can be partially or completely coupled to or combined with each other, and can be variously inter-operated with each other and driven technically. The embodiments of the present disclosure can be carried out independently from each other, or can be carried out together in an interrelated manner.

Hereinafter, an organic light emitting display device will be mainly described as a light emitting display device according to the present disclosure; however, the material for a light emitting element used in the display device is not limited to an organic material. Depending on circumstances, a light emitting material can be an organic material, an inorganic material, such as a quantum dot semiconductor or a nitride semiconductor, or a compound of an organic material and an inorganic material, such as perovskite. Further, all components of each display device according to all embodiments of the present disclosure are operatively coupled and configured.

Figure 1:
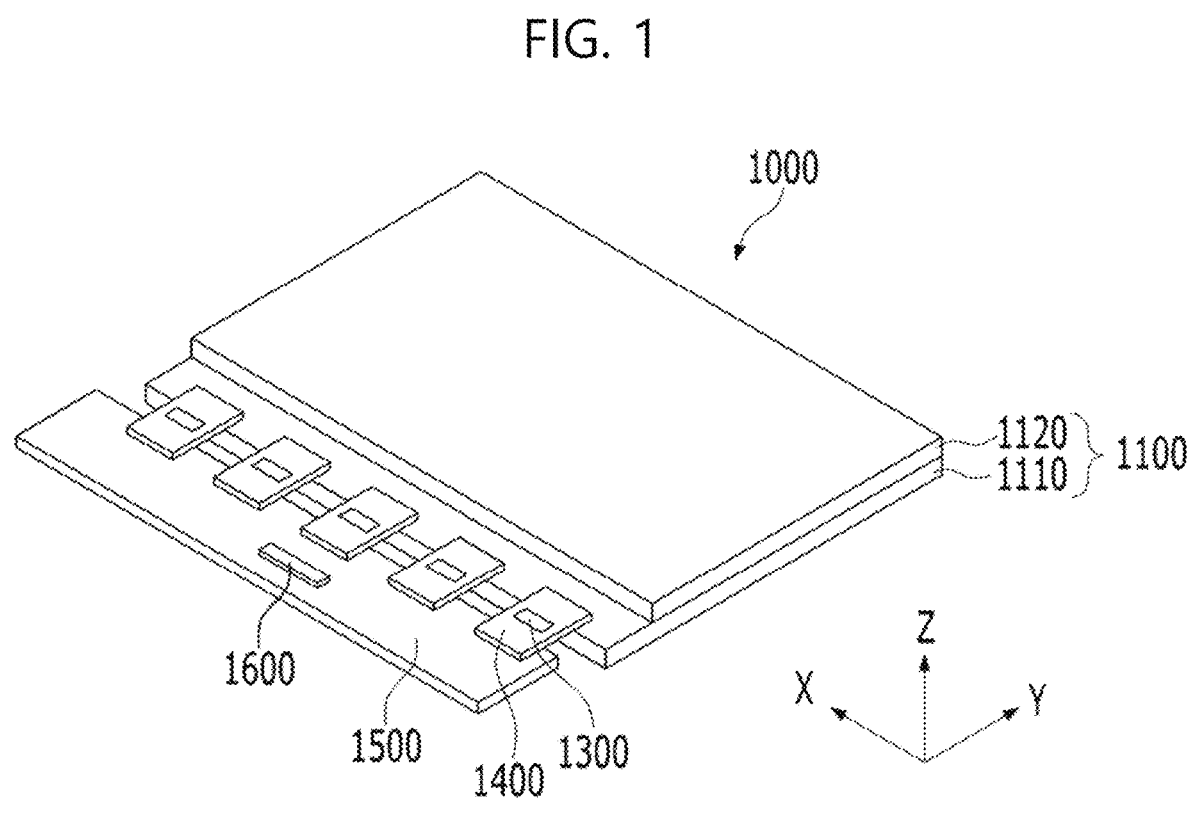

FIG. 1 is a perspective view showing a light emitting display device according to an embodiment of the present disclosure, and FIG. 2 is a plan view showing a substrate of FIG. 1.

As shown in FIGS. 1 and 2, a light emitting display device 1000 according to an embodiment of the present disclosure can include a display panel 1100, a scan driver 1200, a flexible film 1400 including a data driver, a circuit board 1500, and a timing controller 1600. The flexible film 1400 can include a drive IC 1300, whereby the flexible film can function as the data driver.

The flexible film 1400 can supply a data signal to a plurality of signal lines provided in the display panel 1100 through several blocks, and can detect a sensing signal, or can correspond to all signal lines provided in the panel 1100 so as to perform the function of the data driver. Depending on circumstances, the flexible film 1400 and the circuit board 1500 can be integrated.

The display panel 1100 can include an array substrate 1110 and an opposite substrate 1120. Each of the array substrate 1110 and the opposite substrate 1120 can include a glass or plastic substrate, and can further include a thin film transistor array, a color filter array, or an optical film. For example, when the array substrate 1110 includes the plastic substrate, the plastic constituting the substrate can be polyimide, polyethylene terephthalate (PET), polyethylene naphthalate (PEN), or polycarbonate (PC). When the array substrate 1110 includes the plastic substrate, the light emitting display device 1000 can be implemented by a flexible display device that can be curved or bent. The opposite substrate 1120 can include any one of glass, a plastic film, and an encapsulation film. When the opposite substrate 1120 is the encapsulation film, the encapsulation film can have a unit structure in which organic films and inorganic films are alternatively disposed, and the films can be formed on the array substrate 1110 without being bonded to the array substrate 1110.

The array substrate 1110 is a thin film transistor substrate on which thin film transistors are formed. Scan lines, signal lines, and subpixels SP are formed on one surface of the array substrate 1110 that faces the opposite substrate 110. The subpixels SP are provided at areas defined by intersections between the scan lines and signal lines. The scan lines are connected to the scan driver 1200, and the signal lines are connected to the data driver 1400. In addition, as shown, the scan driver 1200 can be directly mounted in a non-display area NDA of the array substrate 1110, or a separate drive IC or a printed circuit film can be connected to the non-display area NDA of the array substrate 1110.

As shown in FIG. 2, the display panel 1110 can be divided into a display area DA, in which the subpixels SP are formed to display an image, and a non-display area NDA, in which no image is displayed. The scan lines, the signal lines, and the subpixels SP can be formed in the display area DA. The scan driver 1200, pads, and link lines configured to connect the signal lines to the pads can be formed in the non-display area NDA.

Each subpixel SP can be divided into an emission portion EM, which substantially emits light, and a pixel circuit PC disposed outside the emission portion EM, the pixel circuit PC having a line and a transistor provided therein.

The pixel circuit PC of the subpixel SP can include a plurality of transistors as switching elements configured to be turned on according to scan signals of the scan lines to receive data voltage of the signal lines. Each transistor can be a thin film transistor. The transistors of the subpixel SP can have the same stack structure having active layers formed on the same layer or a hetero stack structure having active layers formed on different layers.

The light emitting display device according to the present disclosure is characterized in that a ramp and an optional bumpy pattern are provided at an upper surface of an organic insulating film, on which an anode is formed, whereby separation between anodes is easily achieved.

Hereinafter, the light emitting display device according to the present disclosure will be described in detail.

Figure 3:
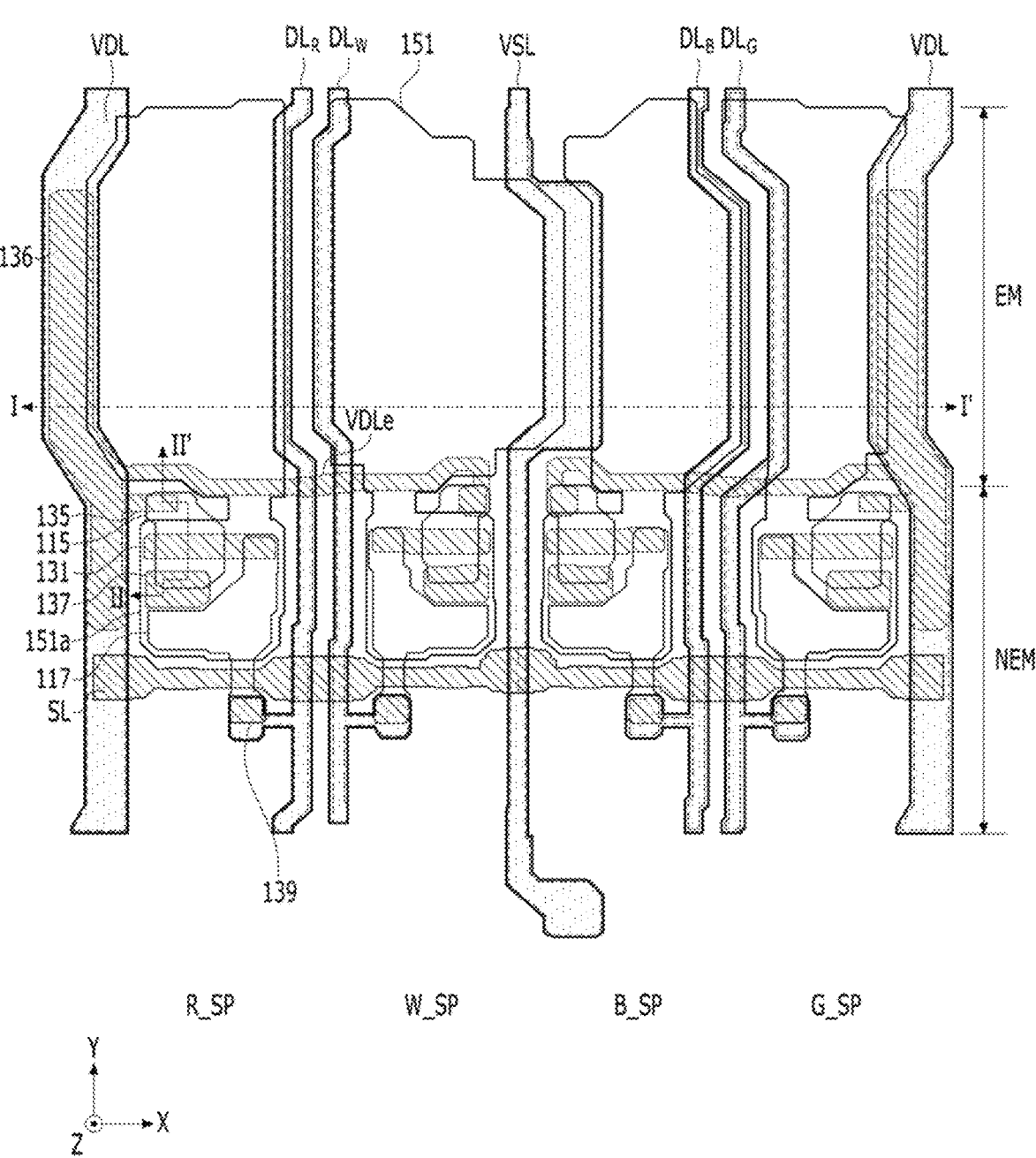
FIG. 3 is a plan view showing an example of the light emitting display device according to the present disclosure.
Figure 4:
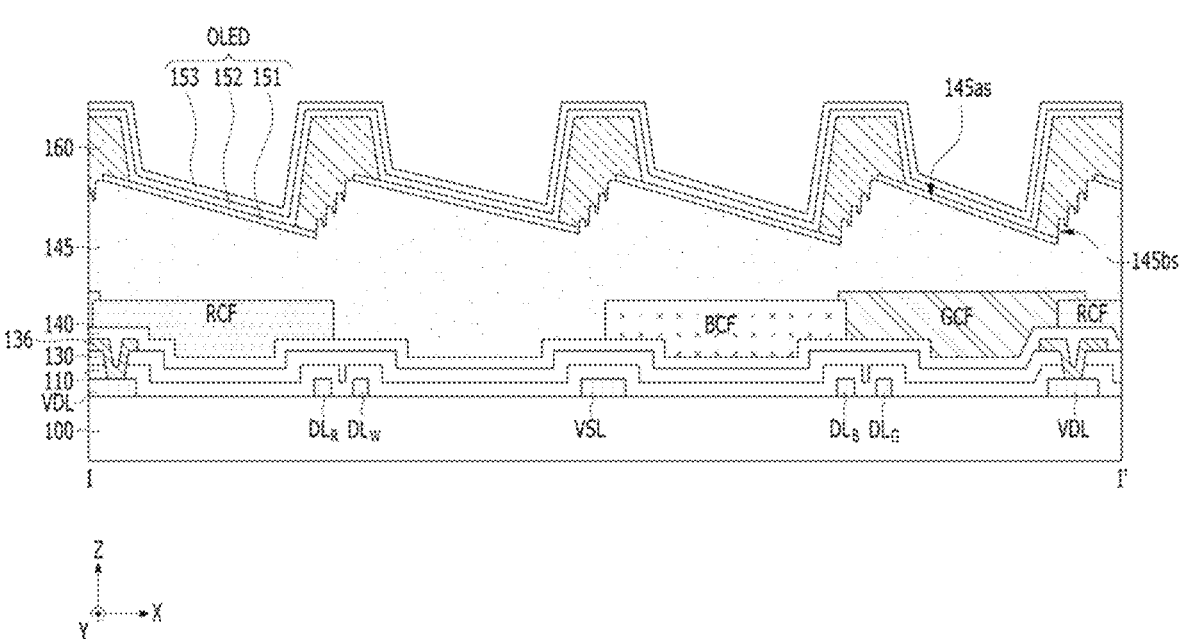
FIG. 4 is a sectional view taken along line I-I' of FIG. 3.
Figure 5:
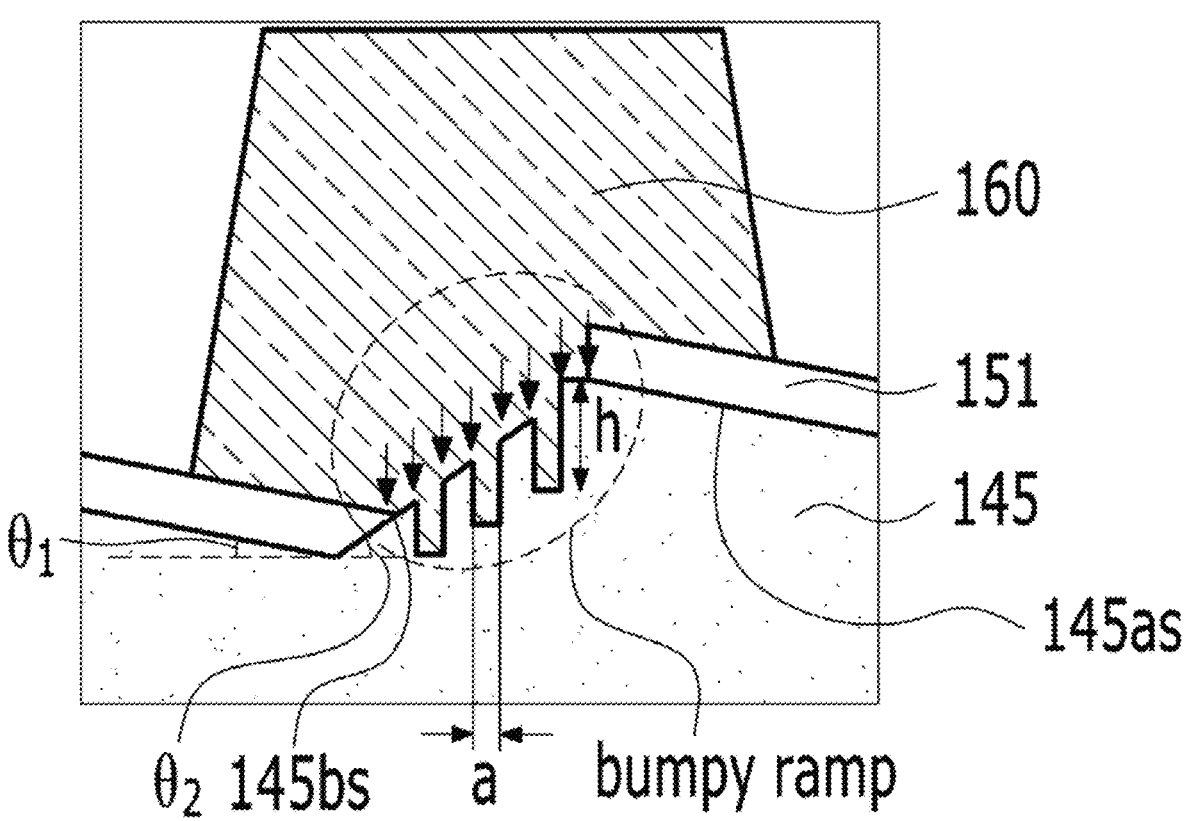
FIG. 5 is an enlarged view of a bank and a lower structure of FIG. 4.
Figure 6:
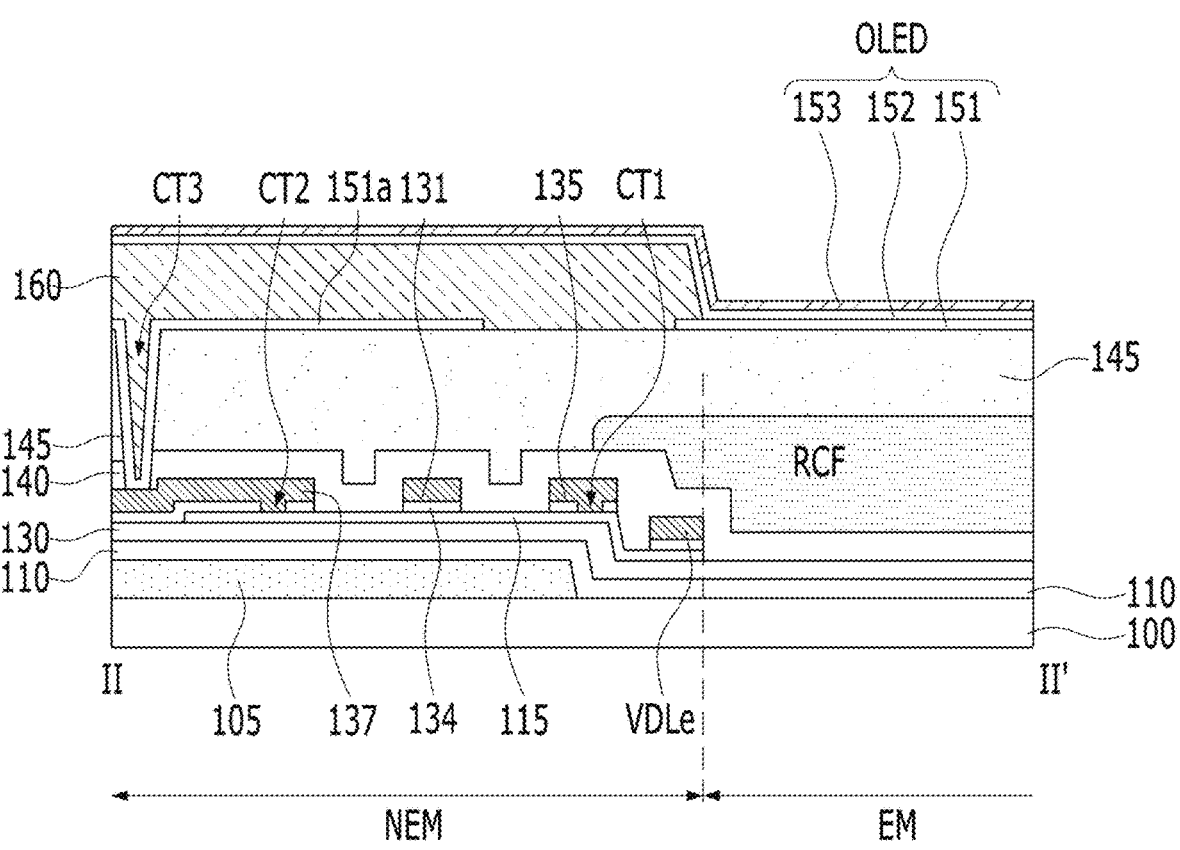
FIG. 6 is a sectional view taken along line II-II' of FIG. 3.
Figure 6:
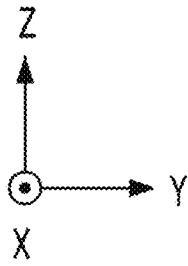
Figure 7:
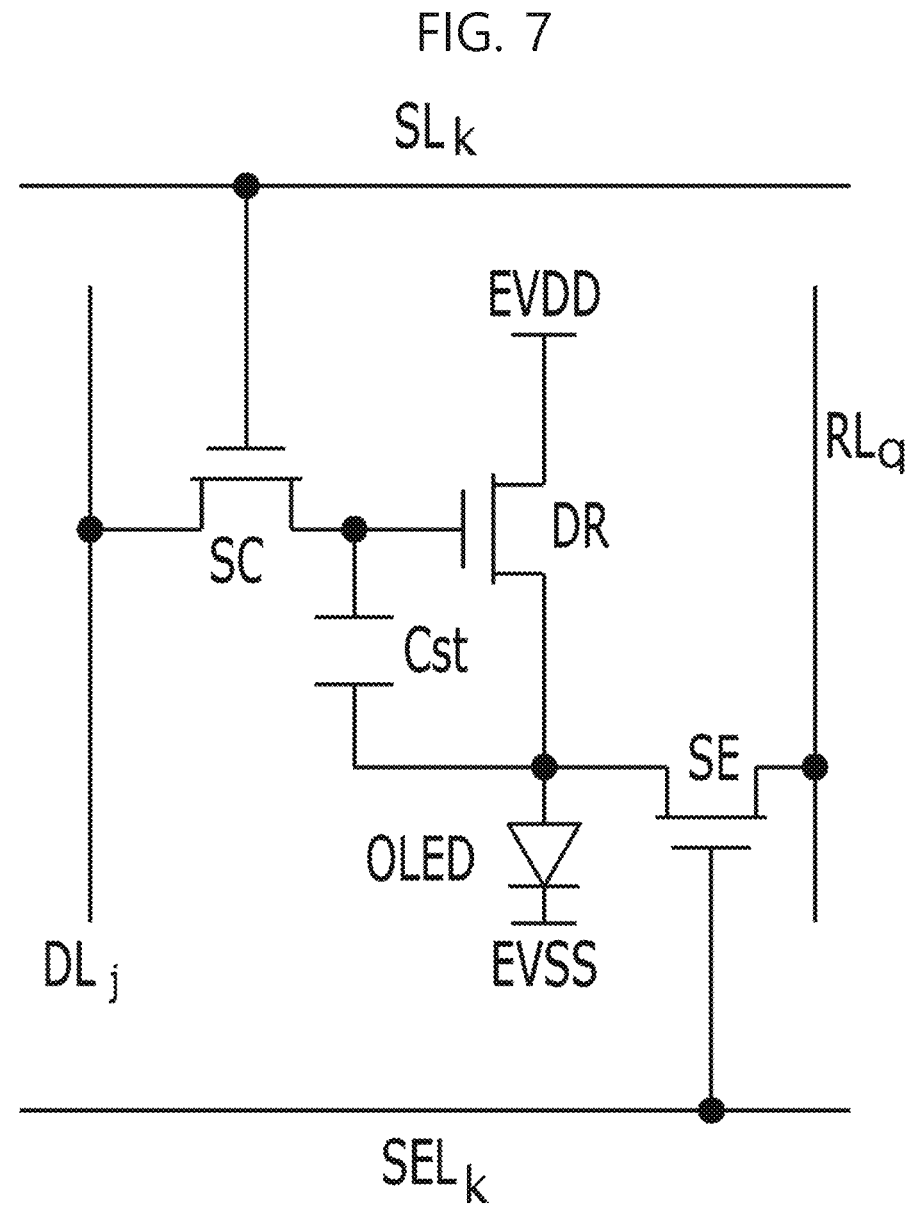

FIG. 3 is a plan view showing an example of the light emitting display device according to the present disclosure, FIG. 4 is a sectional view taken along line I-I' of FIG. 3, and FIG. 5 is an enlarged view of a bank and a lower structure of FIG. 4. FIG. 6 is a sectional view taken along II-II' of FIG. 3. FIG. 7 is a circuit diagram corresponding to one subpixel of FIG. 3.

As shown in FIGS. 3 to 5, the light emitting display device according to the present disclosure includes a substrate 100 having a plurality of subpixels R_SP, W_SP, B_SP, and G_SP and an organic insulating film 145 having first ramps 145*as* and second ramps 145*bs* alternately formed so as to correspond to the subpixels R_SP, W_SP, B_SP, and G_SP, each of the second ramps 145*bs* having a bumpy pattern.

Anodes 151 on the organic insulating film 145 are formed along the first ramps 145*as*. For example, an anode 151 having a predetermined thickness is provided at each of the subpixels R_SP, W_SP, B_SP, and G_SP along a corresponding one of the first ramps 145*as* on the organic insulating film 145. An upper surface of the organic insulating film 145 is used as a surface for formation of each anode 151.

A light emitting element OLED provided at each subpixel in the light emitting display device is a self-emissive element, and the light emitting element OLED includes an anode 151, an organic layer 152 including an emission layer and a plurality of common layers, and a cathode 153.

The light emitting element OLED includes an emission portion of each of the subpixels R_SP, W_SP, B_SP, and G_SP defined in an open area of a bank 160 formed at the anode 151. For example, light can be emitted in an area in which no bank 160 is formed. In the emission portion, a part of the first ramp 145*as* may be exposed in the first direction. Among the components of the light emitting element OLED, the anode 151 receives a signal from a thin film transistor TFT. In order to independently drive the light emitting elements OLED, the light emitting element OLED is configured to correspond to each of the subpixels R_SP, W_SP, B_SP, and G_SP.

Consequently, it is important to divide the anodes 151 so as to correspond to each of the subpixels R_SP, W_SP, B_SP, and G_SP. In addition, high resolution of the light emitting display device is required in order to display a more vivid image. The distance between the anodes of the adjacent subpixels R_SP, W_SP, B_SP, and G_SP is gradually reduced due to the limited area and increasing resolution. When an anode residual film remains between adjacent subpixels, therefore, even in a turn-off state, a weak bright dot can occur due to influence of the adjacent subpixels or other or gradation issue can occur due to influence of the adjacent subpixels. The light emitting display device according to the present disclosure solves or addresses this issue. The physical distance between the adjacent subpixels R_SP, W_SP, B_SP, and G_SP at an upper surface of the organic insulating film 145, on which the anodes 151 are formed, in a first direction (e.g., x-axis direction) can be increased by the first ramps 145*as*, the second ramps 145*bs*, and the bumpy patterns formed at the second ramps 145*bs*, whereby it is possible to easily separate the adjacent subpixels from each other in an etching process of the anodes 151.

In addition, when more than a predetermined physical distance occurs at the bumpy pattern and the anodes 151 are separated from each other at any position of the bumpy pattern, it is possible to separate the adjacent subpixels from each other, and therefore it is possible to more stably separate the anodes 151 of the adjacent subpixels from each other.

The entirety of the emission portion EM and parts of data lines DL_R, DL_W, DL_B, and DL_G, a driving source voltage line VDL, and a ground source voltage line VSL therearound can overlap the first ramp 145*as*, and therefore the first ramp 145*as* can have a larger width than the second ramp 145*bs*. As described above, the first ramp 145*as* and the second ramp 145*bs* can have different widths, the ramp having the large width can have a gentle slope, and the ramp having the small width can have a steep slope.

In the example shown in FIG. 5, the first ramp 145*as* has a first inclination angle $\theta_1$ relative to a flat surface of the substrate 100, and the second ramp 145*bs* has a second inclination angle $\theta_2$ relative to the flat surface of the substrate 100. Here, the second inclination angle $\theta_2$ is greater than the first inclination angle $\theta_1$. In order to increase the area of the emission portion, the width of the emission portion EM is greater than the width of a non-emission portion. More preferably, the width of the first ramp 145*as* is greater than the width of the second ramp 145*bs*, and the first inclination angle $\theta_1$ is less than the second inclination angle $\theta_2$.

Meanwhile, in the light emitting display device according to the present disclosure, as shown in FIGS. 4 and 5, the bumpy pattern having a shape is removed from a surface of the second ramp 145*bs* in a trench shape in the first direction. The bumpy pattern can have a lower surface of a width "a" from the second ramp 145*bs* and a side wall having a height "h" and has a structure in which the lower surface and the side wall are perpendicular to each other while having a great aspect ratio. In this case, an anode formation material can be thinly deposited at the bumpy pattern at the time of deposition thereof due to the structure having the great aspect ratio. The trench-shaped bumpy pattern may have a lower side parallel to a surface of the substrate and a side wall perpendicular to the surface of the substrate. The side wall of the trench-shaped bumpy pattern may be longer than the lower side of the trench-shaped bumpy pattern. As a result, it is possible to easily remove the anode formation material having the small thickness on the surface of the bumpy pattern of the second ramp 145*bs* in an etching process.

In addition, when the bumpy pattern is viewed in section, the sidewall is asymmetric in a leftward-rightward direction, whereby the heights h of the left and right sidewalls of the bumpy pattern of the second ramp are different from each other, and therefore contact between materials above the sidewall of the bumpy pattern is difficult. Consequently, it is possible to structurally easily separate the anode formation material from the bumpy pattern in the etching process, and therefore it is possible to easily remove the anode between the adjacent subpixels in the first direction (X-axis direction).

Also, in the light emitting display device according to the present disclosure, the first ramp 145*as* is located in the emission portion EM, and a light emission area can be increased within the same horizontal distance, compared to the structure of an anode located at a flat surface.

In the example of FIGS. 3 and 4, since subpixels R_SP, W_SP, B_SP, and G_SP having different colors are located in the first direction and the distance therebetween is small, the different first and second ramps 145*as* and 145*bs* are alternately disposed at the upper surface of the organic insulating film 145, which is used as the anode formation surface, in the first direction.

Contrary to what is shown in FIG. 3, when the distance between the emission portions is short and subpixels having different colors are disposed in a Y-axis direction (second direction), the different first and second ramps 145*as* and 145*bs* are alternately disposed in the Y-axis direction. A second distance between the anodes of adjacent subpixels in the second direction may be greater than a first distance between the anodes of adjacent subpixels in the first direction. A pixel drive circuit may be in the second distance.

When the different subpixels have an arrangement of different colors at a row and a column, not a stripe shape, the first and second ramps 145as and 145bs can be provided at both the row and the column, the bumpy pattern can be applied to the second ramp 145bs of the portion that overlaps the bank 160 such that separation between the anodes 151 of the adjacent subpixels is easily achieved.

Depending on circumstances, in a structure in which the subpixels have the same colors in a diagonal direction, the first and second ramps 145as and 145bs can be provided in the diagonal direction, and the bumpy pattern can be applied to the second ramp 145bs of the portion that overlaps the bank 160 such that separation between the anodes 151 of the adjacent subpixels is easily achieved.

In the example shown, the bank 160 provided on the organic insulating film 145 is located so as to overlap the entirety of the second ramp 145bs and a part of the anode 151 on the first ramp 145as of both adjacent subpixels in the first direction (X-axis direction), and the bank 160 covers the second ramp 145bs and a part of each of the first ramp 145as at opposite sides of the second ramp 145bs.

In the light emitting display device according to the present disclosure, the organic insulating film 145 has different first and second ramps 145as and 145bs in the first direction (X-axis direction) in which at least the distance between the anodes 151 of the adjacent subpixels is small with respect to the organic insulating film 145, on which the anode 151 is formed, the first ramp 145as corresponds to the anode 151 located in the emission portion EM, and the second ramp 145bs has a bumpy pattern.

FIG. 4 shows a bottom emission structure in which light is emitted downwards from the substrate 100 by way of example. In this case, white light emitted from the light emitting elements OLED passes through color filters RCF, BCF, and GCF thereunder, and light selectively transmitted through the color filters RCF, BCF, and GCF is transmitted through the substrate 100 for the subpixels R_SP, W_SP, B_SP, and G_SP. Here, the white subpixel W_SP has no color filter, and white light emitted from the light emitting elements OLED is directly transmitted downwards through the substrate 100. However, the present disclosure is not limited thereto. The case in which the white subpixel further includes a white pigment layer in order to achieve similar efficiency, in addition to the red, green, and blue subpixels, can also be possible. The color filter may be provided under the organic insulating film 145 to correspond to each of the subpixels, and the color filter may have a larger width than the first ramp 145as. The organic insulating film 145 may cover the color filter.

In this case, the anode 151 can be a transparent electrode made of ITO, IZO, or ITZO, and the cathode 153 can be a reflective electrode made of a metal, such as aluminum (Al), silver (Ag), magnesium (Mg), ytterbium (Yb), or strontium (Sr) or an alloy including one or more thereof.

In addition, although the example shown is the bottom emission structure, the light emitting display device according to the present disclosure is characterized in that the organic insulating film 145 has different first and second ramps 145as and 145bs in the first direction (X-axis direction) in which at least the distance between the anodes 151 of the adjacent subpixels is small, the first ramp 145as corresponds to the anode 151 located in the emission portion EM, and the second ramp 145bs has a bumpy pattern. Consequently, the light emitting display device according to the present disclosure is extensively applicable to a top emission display device or a transparent display device.

In the example of FIGS. 3 and 4, the data lines DL_R, DL_W, DL_B, and DL_G, the driving source voltage line VDL, and the ground source voltage line VSL extend in a second direction (e.g., Y-axis direction), which intersects the first direction (X-axis direction), and the driving source voltage line VDL, the data lines DL_R and DL_W, the ground source voltage line VSL, and data lines DL_B and DL_G are sequentially disposed between the subpixels in the X-axis direction.

The data lines can supply data voltage to the subpixels adjacent to opposite sides thereof, the ground source voltage line VSL can supply ground source voltage to four subpixels neighboring in the leftward-rightward direction, and the driving source voltage line VDL can supply driving source voltage to four subpixels neighboring in the leftward-rightward direction.

In addition, a scan line SL and a sensing line SEL can be provided in the x-axis direction so as to intersect the data lines DL_R, DL_W, DL_B, and DL_G, the driving source voltage line VDL, and the ground source voltage line VSL.

A plurality of transistors and a storage capacitor can be provided between the data lines DL_R, DL_W, DL_B, and DL_G, the driving source voltage line VDL, the ground source voltage line VSL, the scan line SL, and the sensing line SEL, and a pixel circuit PC including the same can be provided in the non-emission portion NEM. A concrete example of the pixel circuit PC will be described below.

Meanwhile, depending on circumstances, when the light emitting display device has a top emission structure, the pixel circuit PC and the emission portion EM can overlap each other. In this case, the anode 151 can include a reflective electrode, and the cathode 153 can be a transparent electrode or a transflective electrode. The reflective electrode can be made of a metal, such as aluminum (Al), silver (Ag), magnesium (Mg), ytterbium (Yb), strontium (Sr), platinum (Pt), or copper (Cu), or an alloy including one or more thereof. The transparent electrode can be made of ITO, IZO, or ITZO, and the transflective electrode can be configured such that a reflective electrode has a small thickness of 200 Å or less.

As shown in FIG. 5, the uppermost point of the first ramp 145as overlaps the bank 160, and the lowermost point of the second ramp 145bs overlaps the bank 160. Or, uppermost points of the first ramp 145as and the second ramp 145bs may neighbor each other and overlap the bank 160. The reason for this is that it is necessary to locate a region having a changed inclination angle at the bank 160 corresponding to the non-emission portion (NEM).

As shown in FIGS. 6 and 7, the pixel drive circuit of each subpixel SP includes a driving transistor DR, a switching transistor SC, and a sensing transistor SE. FIG. 7 shows that each transistor is an N-type semiconductor transistor having N-type semiconductor characteristics by way of example. However, the present disclosure is not limited thereto. For example, all transistors or some transistors can be constituted by P-type semiconductor transistors having P-type semiconductor characteristics.

Each subpixel can further include a storage capacitor Cst capable of storing differential voltage between a gate electrode and a source electrode of the driving transistor in order to stabilize characteristics of the pixel circuit during driving of the light emitting element OLED.

As shown in FIGS. 3, 6, and 7, the light emitting element OLED emits light upon receiving current through the driving transistor DR. The anode 151 of the light emitting element OLED can be connected to a source electrode 137 of the driving transistor DR, and the cathode 153 can be connected to the ground source voltage line VSL located adjacent to the subpixels in the display area DA of the substrate 100 in order to receive ground source voltage.

When voltage is applied to the first electrode 151 and the second electrode 153 of the light emitting diode OLED, holes and electrons move to the emission layer via a hole transport layer and an electron transport layer in the organic layer 152, respectively, and the holes and electrons are combined with each other in the emission layer, whereby light is emitted.

The driving transistor DR is disposed between the driving source voltage line VDL to which driving source voltage EVDD is supplied and the light emitting element OLED. The driving transistor DR adjusts current that flows from the driving source voltage line VDL to the light emitting element OLED based on voltage difference between a gate electrode 131 and a source electrode 137. The gate electrode 131 of the driving transistor DR can be connected to a source electrode (the same node as 131 of FIG. 3) of the switching transistor SC, a drain electrode 135 of the driving transistor DR can be connected to the driving source voltage line VDL, and the source electrode 137 can be connected to the anode 151 of the light emitting element OLED. As shown in FIG. 3, the drain electrode 135 of the driving transistor DR can be integrally formed with a first connection line 136 connected to the driving source voltage line VDL in an overlapping state.

In addition, as shown in FIGS. 3 and 6, the gate electrode 131 overlaps a channel, and the driving transistor DR can include a first semiconductor layer 115 having opposite sides connected to the source electrode 137 and the drain electrode 135 via second and first contact holes CT2 and CT1.

The switching transistor SC has the scan line SL as a gate electrode and includes a drain electrode 139 protruding from the data line DL and a source electrode integrally formed with the gate electrode 131 of the driving transistor DR. The scan line SL overlaps the channel, and the switching transistor SC includes a second semiconductor layer 117 having opposite sides connected to the source electrode 131 and the drain electrode 139.

In addition, the sensing transistor SE has the sensing line SEL as a gate electrode and includes a drain electrode 238 protruding from the ground source voltage line VSL and a source electrode 138 facing the drain electrode 238 in the state in which the sensing line SEL is interposed therebetween. The sensing line SEL overlaps the channel, and the sensing transistor SE may include a third semiconductor layer having opposite sides connected to the source electrode and the drain electrode.

Meanwhile, a blocking metal layer 105 made of a light blocking metal can be further provided under the semiconductor layer 115 in order to block transmission of light to the semiconductor layer 115 from under the substrate 100.

The blocking metal layer 105 can be the same layer as the data lines $DL_R$, $DL_W$, $DL_B$, and $DL_G$, the driving source voltage line VDL, and the ground source voltage line VSL.

First and second buffer layers 110 and 130 can be provided on the blocking metal layer 105. The first and second buffer layers 110 and 130 can be made of different inorganic insulating films. For example, different materials selected from among an oxide film, a nitride film, and an oxynitride film can be used for the first and second buffer layers 110 and 130.

Depending on circumstances, any one of the first and second buffer layers 110 and 130 can be omitted.

A gate insulating film 134 can be further interposed between the gate electrode 131 and the channel of the semiconductor layer 115. The gate insulating film 134 or an interlayer insulating film can be provided at the portion at which the second and first contact holes CT2 and CT1 are not located between the semiconductor layer 115 and the source electrode 137 and the drain electrode 135

In addition, a passivation film 140 can be further formed in order to protect the switching transistor SC and the sensing transistor SE, as well as the driving transistor DR.

Each of the gate insulating film 134, the interlayer insulating film, and the passivation film 140 can be made of an inorganic insulating film, such as an oxide film, a nitride film, and an oxynitride film.

Color filter layers RCF, GCF, and BCF can be formed at the respective subpixels so as to overlap the emission portion EM. An edge of the color filter may overlap a part of the bumpy pattern.

FIG. 6 shows connection between the driving transistor DR and the anode 151 in the second direction (Y-axis direction). The anode 151 in the emission portion EM is integrally formed with an anode extension pattern 151*a* located in the non-emission portion NEM, in which components of the pixel circuit including the driving transistor DR are located, and the same signal is applied thereto. In this case, the portion of the non-emission portion NEM at which the anode extension pattern 151*a* is located is sufficiently spaced apart from the anode 151 of a subpixel adjacent thereto in the second direction (Y-axis direction), whereby a line identical or similar to the first ramp 145*as* extends in the second direction, and therefore the organic insulating film 145 has a flat surface in the second direction intersecting the first direction.

When the distance between the anodes 151 or the anode extension patterns 151*a* is small in the second direction (Y-axis direction), as previously described, the structure in which the first and second ramps are alternately disposed and the bumpy patterns are disposed at the second ramps can be applied for clear separation between the anodes of the adjacent subpixels.

Here, VDLe, which is in FIGS. 3 and 6, is an extension portion that extends from the driving source voltage line VDL in the horizontal direction (X-axis direction or the first direction).

The switching transistor SC is turned on by a k-th scan signal of a k-th scan line $SL_k$ to supply voltage from a j-th data line $DL_j$ to the gate electrode of the driving transistor DR. The gate electrode of the switching transistor SC can be connected to the k-th scan line $SL_k$, the source electrode can be connected to the gate electrode of the driving transistor DR, and the drain electrode can be connected to the j-th data line $DL_j$.

The sensing transistor SE is turned on by a k-th initialization signal of a k-th sensing line $SE_k$ to connect a q-th reference voltage line $RL_q$ to the source electrode of the driving transistor DR. The gate electrode of the sensing transistor SE can be connected to the k-th sensing line $SE_k$, the drain electrode can be connected to the q-th reference voltage line $RL_q$, and the source electrode can be connected to the source electrode of the driving transistor DR.

The storage capacitor Cst stores differential voltage between gate voltage and source voltage of the driving transistor DR.

One-side electrode of the storage capacitor Cst can be connected to the gate electrode of the driving transistor DR and the source electrode of the switching transistor SC, and the other-side electrode can be connected to the source electrode of the driving transistor DR, the source electrode of the sensing transistor SE, and the anode 151 or the anode extension pattern 151*a* of the light emitting element OLED.

When a specific subpixel SP is selected by the switching transistor SC, driving current can be supplied to the light emitting element OLED through the driving transistor of the subpixel.

The pixel circuit (pixel driver) of FIGS. 3 and 6 is an example, and the circuit can be configured by adding or subtracting the thin film transistor or adding the storage capacitor or a compensation capacitor.

Hereinafter, the effect of the light emitting display device according to the present disclosure will be described based on comparison with a light emitting display device according to a comparative example in which an anode is formed on a flat surface of an organic insulating film.

Figure 8:
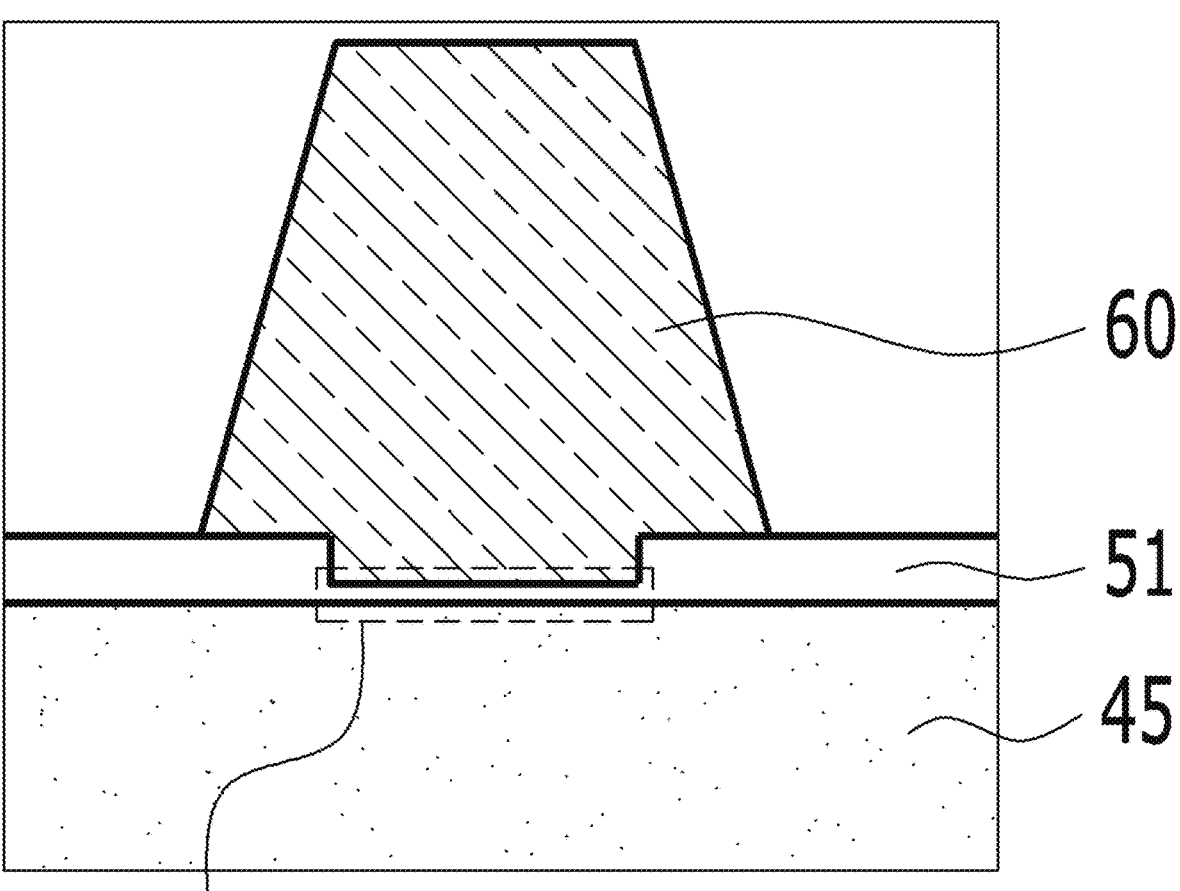
FIG. 8 is a sectional view showing an anode residual film between adjacent subpixels in a light emitting display device according to a comparative example.

FIG. 8 is a sectional view showing an anode residual film between adjacent subpixels in the light emitting display device according to the comparative example.

As shown in FIG. 8, in the light emitting display device according to the comparative example, under emission portions of adjacent subpixels divided by a bank 60, anodes 51 are not separated from each other between the subpixels, whereby a residual film remains.

In particular, with increasing resolution of the light emitting display device, the required distance between anodes of subpixels is reduced. In the light emitting display device according to the comparative example, a residual film is generated when the anodes 51 are formed on the flat organic insulating film 45, whereby the subpixels are not completely separated from each other.

Figure 9A:
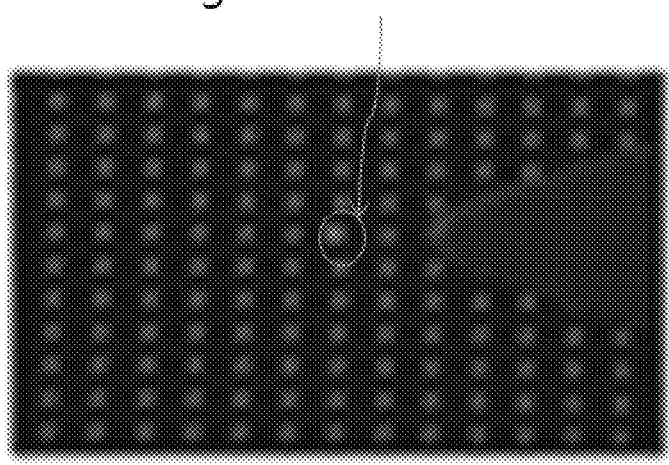
FIGS. 9A and 9B are optical photographs showing bright dot defects and short circuit between adjacent subpixels when there is an anode residual film between the adjacent subpixels in the light emitting display device according to the comparative example.
Figure 9B:
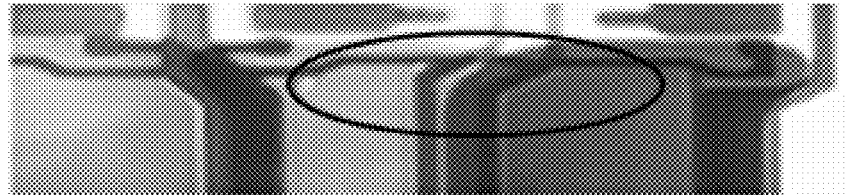

FIGS. 9A and 9B are optical photographs showing bright dot defects and short circuit between adjacent subpixels when there is an anode residual film between the adjacent subpixels in the light emitting display device according to the comparative example.

In the light emitting display device according to the comparative example, as shown in FIG. 9A, driving current from an adjacent subpixel is further supplied to the portion at which the residual film is generated when gray is expressed, whereby bright dot defects can occur (see, e.g., the circled area in FIG. 9A).

FIG. 9B is an optical photograph thereof, wherein short circuit occurs between anodes of a green subpixel and a blue subpixel adjacent to each other, whereby green light is generated at an upper side of the blue subpixel (see, for example, the circled areas in FIG. 9B).

In the light emitting display device according to the present disclosure, different first and second ramps are provided in the first direction in which at least the distance between the anodes of the adjacent subpixels is small with respect to the organic insulating film, on which the anode is formed, the first ramp corresponds to the anode located in the emission portion, and the second ramp has a bumpy pattern. Consequently, the physical distance in the first direction is increased, whereby separation between the anodes of the subpixels is easily performed in an etching process for anode formation. In addition, when more than a predetermined physical distance occurs at the bumpy pattern and the anodes are separated from each other at any position of the bumpy pattern, it is possible to separate the adjacent subpixels from each other, and therefore it is possible to more stably separate the anodes of the adjacent subpixels from each other. Consequently, it is possible to prevent bright dot defects and short circuit between the anodes of the adjacent subpixels, which occurs in the light emitting display device according to the comparative example.

In addition, the bumpy pattern is located at the second ramp and has a structure in which the lower surface and the side wall thereof are perpendicular to each other, whereby an anode formation material deposited under the same conditions has a small thickness on the surface of the bumpy pattern, and therefore it is possible to easily remove the anode formation material in an etching process.

In addition, when the bumpy pattern is viewed in section, the sidewall is asymmetric in the leftward-rightward direction, whereby the heights of the left and right sidewalls of the bumpy pattern of the second ramp are different from each other. Therefore contact between materials above the sidewall of the bumpy pattern is difficult. Consequently, it is possible to structurally easily separate the anode formation material from the bumpy pattern in the etching process.

Figure 10:
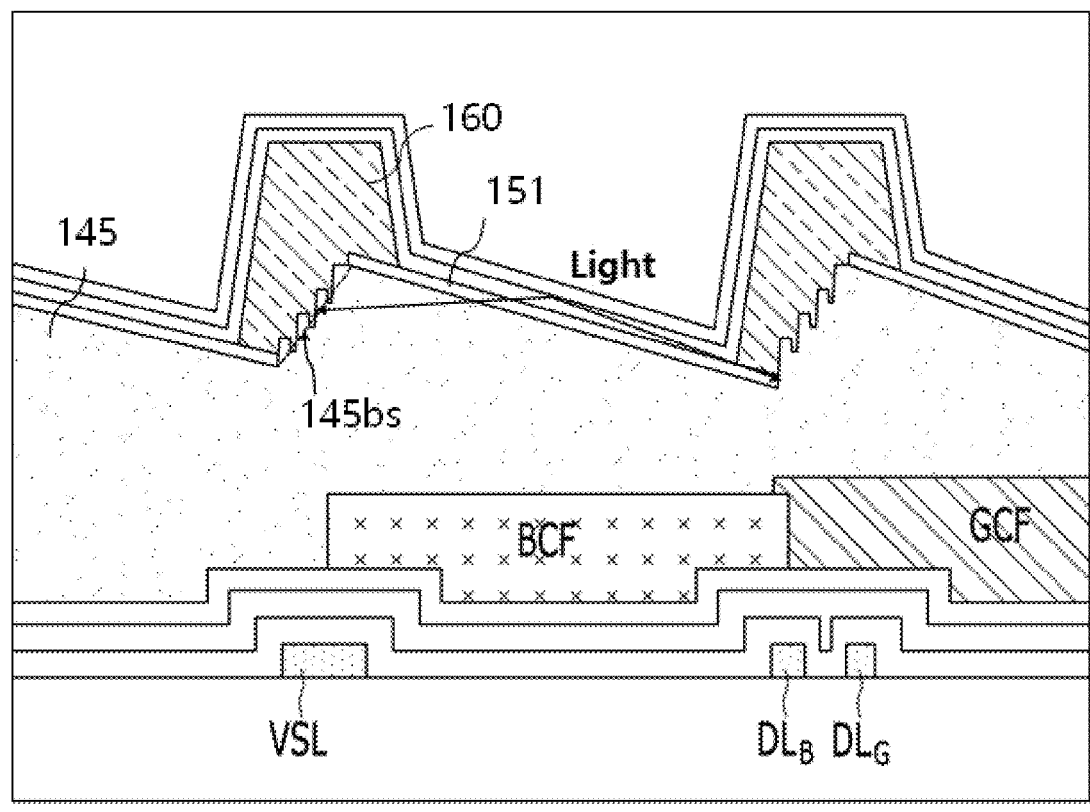
FIG. 10 is a view showing the principle by which a bumpy ramp prevents transmission of light to a subpixel adjacent thereto in the light emitting display device according to the present disclosure.

FIG. 10 is a view showing the principle by which the bumpy ramp prevents transmission of light to a subpixel adjacent thereto in the light emitting display device according to the present disclosure.

In the light emitting display device according to the present disclosure, as shown in FIG. 10, the emission portion is inclined while having the first ramp 145$as$, whereby light spreading in the leftward-rightward direction or light spreading at an angle less than the second inclination angle $\theta_2$ of the second ramp 145$bs$, among light radially emitted from the organic layer 152 of the light emitting element OLED, can be blocked by the bank 160 and the second ramp 145$bs$ thereunder. For example, it is possible to structurally prevent light emitted from a specific subpixel that is turned on from affecting a subpixel adjacent thereto.

In addition, it is possible to effectively prevent luminance deviation of a viewing angle at which the light emitting display device is viewed from the front at a specific angle by providing the second ramp under the bank 160.

When the bank 160 includes a black material depending on circumstances, it is possible to prevent mixture of colors between adjacent subpixels and to further effectively prevent luminance deviation of the viewing angle.

For example, in the light emitting display device according to the present disclosure, the uppermost point at which different ramps join each other is provided at the bank, whereby the ramp and the bumpy pattern prevent light radially emitted from a subpixel from being transmitted to a subpixel adjacent thereto, and therefore it is possible to reduce or prevent degradation of image quality due to a change in the viewing angle.

To this end, a light emitting display device according to an embodiment of the present disclosure can include a substrate having a plurality of subpixels, an organic insulating film having first ramps and second ramps alternately formed so as to correspond to the subpixels in a first direction, each of the second ramps being provided with a bumpy pattern, an anode provided at each of the subpixels along a corresponding one of the first ramps on the organic insulating film, the anode having a predetermined thickness, a bank provided on the organic insulating film so as to overlap entireties of the second ramps and parts of the anodes on the first ramps of both adjacent subpixels in the first direction, and an organic layer and a cathode provided on the anode.

A light emitting display device according to an embodiment of a present disclosure can comprise a substrate having a plurality of subpixels, an organic insulating film having first ramps and second ramps alternately to correspond to the subpixels in a first direction, each of the second ramps being provided with a bumpy pattern, an anode at each of the subpixels along a corresponding one of the first ramps on the organic insulating film, the anode having a predetermined thickness, a bank on the organic insulating film to overlap entireties of the second ramps and parts of the anodes on the first ramps of both adjacent subpixels in the first direction and an organic layer and a cathode on the anode.

In a light emitting display device according to an embodiment of a present disclosure, a second inclination angle of the second ramp relative to a surface of the substrate can be greater than a first inclination angle of the first ramp relative to the surface of the substrate.

In a light emitting display device according to an embodiment of a present disclosure, uppermost points of the first ramp and the second ramp can neighbor each other and can overlap the bank. The bumpy pattern can have a shape removed from a surface of the second ramp in a trench shape in the first direction. The trench-shaped bumpy pattern can have a lower side parallel to a surface of the substrate and a side wall perpendicular to the surface of the substrate.

In a light emitting display device according to an embodiment of a present disclosure, the side wall of the trench-shaped bumpy pattern can be longer than the lower side of the trench-shaped bumpy pattern.

A light emitting display device according to an embodiment of a present disclosure may further comprise a color filter provided under the organic insulating film to correspond to each of the subpixels, the color filter having a larger width than the first ramp and the organic insulating film covers the color filter.

In a light emitting display device according to an embodiment of a present disclosure, an edge of the color filter can overlap a part of the bumpy pattern.

In a light emitting display device according to an embodiment of a present disclosure, the organic insulating film can have a flat surface in a second direction intersecting the first direction.

In a light emitting display device according to an embodiment of a present disclosure, a second distance between the anodes of adjacent subpixels in the second direction can be greater than a first distance between the anodes of adjacent subpixels in the first direction.

A light emitting display device according to an embodiment of a present disclosure can further comprise a pixel drive circuit in the second distance.

In a light emitting display device according to an embodiment of a present disclosure, each of the subpixels can have an emission portion, in which a part of the first ramp is exposed, in the first direction.

As is apparent from the above description, a light emitting display device according to the embodiments of the present disclosure has the following effects.

First, different first and second ramps are provided in a first direction in which at least the distance between anodes of adjacent subpixels is small with respect to an organic insulating film, on which an anode is formed, the first ramp corresponds to the anode located in an emission portion, and the second ramp has a bumpy pattern. Consequently, the physical distance in the first direction is increased, whereby separation between the anodes of the subpixels is easily performed in an etching process for anode formation. In addition, when more than a predetermined physical distance occurs at the bumpy pattern and the anodes are separated from each other at any position of the bumpy pattern, it is possible to separate the adjacent subpixels from each other, and therefore it is possible to more stably separate the anodes of the adjacent subpixels from each other.

Second, the bumpy pattern is located at the second ramp and has a structure in which a lower surface and a side wall thereof are perpendicular to each other, whereby an anode formation material deposited under the same conditions has a small thickness on the surface of the bumpy pattern, and therefore it is possible to easily remove the anode formation material in an etching process.

Third, when the bumpy pattern is viewed in section, the sidewall is asymmetric in a leftward-rightward direction, whereby the heights of the left and right sidewalls of the bumpy pattern of the second ramp are different from each other, and therefore contact between materials above the sidewall of the bumpy pattern is difficult. Consequently, it is possible to structurally easily separate the anode formation material from the bumpy pattern in the etching process.

Fourth, the uppermost point at which different ramps join each other is provided at a bank, whereby the ramp and the bumpy pattern prevent light radially emitted from a subpixel from being transmitted to a subpixel adjacent thereto, and therefore it is possible to reduce or prevent degradation of image quality due to a change in the viewing angle.

While the embodiments of the present disclosure have been described with reference to the accompanying drawings, the present disclosure is not limited to the embodiments and can be embodied in various different forms, and those skilled in the art will appreciate that the present disclosure can be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:
a substrate having subpixels;
an organic insulating film having first ramps and second ramps alternately to correspond to the subpixels in a first direction, each of the second ramps being provided with a bumpy pattern;
an anode at each of the subpixels along a corresponding one of the first ramps on the organic insulating film, the anode having a predetermined thickness;
a bank on the organic insulating film to overlap entireties of the second ramps and parts of one anode and another anode on the first ramps of both adjacent subpixels in the first direction; and
an organic layer and a cathode on the anode, wherein:
uppermost points of the first ramp and the second ramp neighbor each other and overlap the bank,
the bumpy pattern has at least one trench removed from a surface of the second ramp, and
the at least one trench of the bumpy pattern has a lower side parallel to a surface of the substrate and a side wall perpendicular to the surface of the substrate.

2. The light emitting display device according to claim 1, wherein a second inclination angle of the second ramp relative to a surface of the substrate is greater than a first inclination angle of the first ramp relative to the surface of the substrate.

3. The light emitting display device according to claim 1, wherein the side wall of the at least one trench of the bumpy pattern is longer than the lower side of the at least one trench of the bumpy pattern.

4. The light emitting display device according to claim 1, further comprising:
a color filter provided under the organic insulating film to correspond to each of the subpixels, the color filter having a larger width than the first ramp,
wherein the organic insulating film covers the color filter.

5. The light emitting display device according to claim 4, wherein an edge of the color filter overlaps a part of the bumpy pattern.

6. The light emitting display device according to claim 1, wherein the organic insulating film has a flat surface in a second direction intersecting the first direction.

7. The light emitting display device according to claim 6, wherein a second distance between the anodes of adjacent subpixels in the second direction is greater than a first distance between the anodes of adjacent subpixels in the first direction.

8. The light emitting display device according to claim 7, further comprising:

a pixel drive circuit in the second distance.

9. The light emitting display device according to claim 1, wherein each of the subpixels has an emission portion, in which a part of the first ramp is exposed, in the first direction.

10. A light emitting display device comprising:

a substrate having a plurality of subpixels;

an organic insulating film having a first ramp and a second ramp correspond to each subpixel of the plurality of subpixels in a first direction, the second ramp being provided with a bumpy pattern;

an anode at each of the plurality of subpixels along the first ramp of the organic insulating film;

a bank on the organic insulating film and a part of the anode, the bank overlapping the bumpy pattern of the second ramp and a part of each first ramp of both adjacent subpixels of the plurality of subpixels in the first direction; and an organic layer and a cathode on the anode, wherein the bumpy pattern of the second ramp comprises at least one trench, the at least one trench having a lower side parallel to a surface of the substrate and a side wall perpendicular to the surface of the substrate.

11. The light emitting display device according to claim 10, wherein:

uppermost points of the first ramp and the second ramp neighbor each other and lowermost points of the first ramp and the second ramp neighbor each other, the uppermost points of the first ramp and the second ramp overlap the bank, and the lowermost points of the first ramp and the second ramp overlap the bank.

12. The light emitting display device according to claim 10, wherein the side wall of the at least one trench is longer than the lower side of the at least one trench.

13. The light emitting display device according to claim 10, further comprising:

a color filter under the organic insulating film to correspond to at least one of the plurality of subpixels, wherein an edge of the color filter overlaps a part of the bumpy pattern.

14. The light emitting display device according to claim 10, wherein the organic insulating film has a flat surface in a second direction parallel to a data line at each subpixel.

15. The light emitting display device according to claim 10, wherein:

the anode at each of the plurality of subpixel is not overlapped with the at least one trench.

16. The light emitting display device according to claim 10, wherein the organic insulating film has a flat surface along a length of one emission portion.

17. A light emitting display device comprising:

a substrate having a plurality of subpixels;

an organic insulating film having a first ramp and a second ramp correspond to each subpixel of the plurality of subpixels in a first direction, the second ramp being provided with a bumpy pattern;

an anode at each of the plurality of subpixels along the first ramp of the organic insulating film;

a bank on the organic insulating film and a part of the anode, the bank overlapping the bumpy pattern of the second ramp and a part of each first ramp of both adjacent subpixels of the plurality of subpixels in the first direction; and an organic layer and a cathode on the anode, wherein the first ramp is singly disposed at each subpixel and a height of the first ramp decreases from one end to the other end in the first direction, wherein each of the one end and the other end of the first ramp overlap the bank, and wherein the bumpy pattern of the second ramp comprises at least one trench, the at least one trench having a lower side parallel to a surface of the substrate and a side wall perpendicular to the surface of the substrate.

18. The light emitting display device according to claim 17, wherein a height of the anode overlapped with a first end of the bank is higher than a height of the anode overlapped with a second end of the bank at an emission portion of each of the plurality of subpixels.

19. The light emitting display device according to claim 17, wherein the side wall of the at least one trench is longer than the lower side of the at least one trench.

* * * * *